United States Patent [19]
Fredrickson et al.

[11] Patent Number: 6,154,870
[45] Date of Patent: Nov. 28, 2000

[54] SIGNAL ERROR-CORRECTION SYSTEM AND METHOD

[75] Inventors: Lisa Fredrickson, Ojai; Reza M. Dehmohseni, Winnetka, both of Calif.

[73] Assignee: Seagate Technology LLC, Scotts Valley, Calif.

[21] Appl. No.: 09/089,874

[22] Filed: Jun. 4, 1998

(Under 37 CFR 1.47)

Related U.S. Application Data

[60] Provisional application No. 60/048,513, Jun. 4, 1997, and provisional application No. 60/050,439, Jun. 27, 1997.

[51] Int. Cl.$^7$ .................................................. H03M 13/03
[52] U.S. Cl. ...................... 714/786; 714/792; 714/794; 714/795; 375/262; 375/263; 375/265; 375/341; 341/94
[58] Field of Search .................................. 714/746, 786, 714/787, 788, 792, 795, 798, 809; 341/58; 11/94; 375/262, 263, 265, 341

[56] References Cited

U.S. PATENT DOCUMENTS

| | | | |
|---|---|---|---|
| 4,945,538 | 7/1990 | Patel | 714/786 |
| 5,095,484 | 3/1992 | Karabed et al. | 714/746 |
| 5,280,489 | 1/1994 | Fredrickson et al. | 714/788 |

*Primary Examiner*—Emmanuel L. Moise
*Attorney, Agent, or Firm*—Shawn B. Dempster; Edward P. Heller, III; Jonathan E. Olson

[57] ABSTRACT

A Viterbi PRML system and method providing a new code with distance properties such that some tribits are allowed but no longer sequences are allowed. A code rate 8/9 is constructed for EPR4 and $E^2PR4$ channels and the system independently maps 8-bit blocks of user data to 9-bit channel sequences. The precoder has transfer function, $f(D)=1/(1 \oplus D)$, and produces a binary channel input $x(D)$, which is fed to a coder, to provide an output signal $y(D)$, which is transmitted and corrupted by noise. The corrupted signal is received and fed to a Viterbi detector. The signal is decoded to produce an estimate of the 8-bit data bytes, as reconstructed to be freed from noise corruption. The encoding protocol of the invention is implemented in the encoder. The protocol is: no sequence of 4 consecutive transitions occurs in any 9-bit codeword; no 9-bit codeword ends with a sequence of 2 or more consecutive transitions; no 9-bit codeword begins with more than 2 consecutive transitions; and sequences of 3 consecutive transitions, if any, begin only on a 2nd, 4th, 6th, or 9th bit of said 9-bit codeword. The protocol is preferably augmented by an additional constraint: no 9-bit codeword has the same 1st, 3rd, 5th, 7th, and 9th bit. Other limitations on coding are described to enhance the performance of the system.

21 Claims, 7 Drawing Sheets

SIGNAL ERROR-CORRECTION SYSTEM AND METHOD

This application is based on Provisional Applications 60/048,513 and 60/050,439, both having the title "Rate 8/9 Code for EPR4 and E²PR4 Channels" and respectively filed Jun. 4 and Jun. 27, 1997. The benefit of the filing dates thereof is claimed herein.

BACKGROUND

This invention concerns a method and apparatus for correcting errors that occur in transmission of information signals between electronic devices. More specifically, the invention relates to correction of such errors in writing information to and reading information from a disk, tape, or optical drive, and in sending and receiving information via telecommunications equipment, such as point to point transmission of data via a satellite or over a telephone line. However, the methodology applies to error correction of information-containing signals transmitted between any two electronic devices. In addition, the invention concerns a computer-readable medium or signal encoded in accordance with the method.

It is known how to optimally detect data sequences transmitted over noisy telecommunications channels by using the Viterbi algorithm. See generally A. J. Viterbi, "Error bounds for convolutional codes and an asymptotically optimum decoding algorithm," *IEEE TRANS. INFO. THEORY*, 13:260–269 (April 1967). Useful background on technology for this application is described in C. B. Shung et al., "Area-Efficient Architectures for the Viterbi Algorithm," 1990 IEEE IBM Research Div., Almaden Research Ctr., UC Berkeley; and L. Fredrickson et al., U.S. Pat. No. 5,280,489 (1994), "Time-varying Viterbi detector for control of error event length". The '489 patent discloses a method and apparatus for detecting spectral null sequences on a noisy telecommunications channel, using a Viterbi detector with a so-called trellis structure to create a further, time-varying trellis structure for limiting the maximum length of so-called dominant error events.

In these references, the D-operator (or D-transform) is commonly used for describing channels, filters, and coding operations. As used in this field of art, the D stands for a delay of one unit time. Thus if the clock for a circuit runs at 1 MHz rate, D represents a delay unit whose output follows its input delayed by 1 μsec. In diagrams, a D in a box represents circuitry, such as a delay line or flip-flop, for a time delay of one cycle duration. In mathematical notation, this D-operator also allows a compact description of sequences and filtering operations. In this usage, the notation u(D), for example, represents the polynomial $$u(D) = \sum_{i=0}^{\infty} u_i D^i$$

which is generally known as the D-transform of the time domain sequence $u=\{u_0, u_1, u_2, \ldots\}$. This notation provides a compact way to express that the first member of the sequence is $u_0$, the second output is $u_1$, and so on. A known property of D-transforms is that a filter with transfer function f(D) and input u(D) produces the output f(D) u(D), where the product is taken by standard polynomial multiplication.

Recently, several approaches have been proposed for trellis structures utilizing partial response channels with transfer functions of the form $(1-D)(1+D)^n$. See, for example, P. Siegel et al., "An 8/9 rate trellis code for E²PR4," presented UC SD CMRR, May 1997; W. Bliss, "An 8/9 rate time-varying trellis code for high-density recordings," INTERMAG 97; I. J. Moon et al., "Maximum transition run codes for data storage systems," IEEE TRANS. MAG., 32:3992–94 (September 1996). When the value of n is 2, the partial response channel is known as EPR4; when the value of n is 3, the partial response channel is known as E²PR4. On magnetic storage channels, these approaches are appropriate at relatively high user densities, such as when the ratio of magnetic pulse width at half amplitude ($pw_{50}$) to time per user bit is 2.4 or higher. At such high user densities, the most common error event is a failure to detect a sequence of three transitions (tribits) or longer sequences of consecutive transitions. Maximum transition run (MTR) codes such as that of Moon et al., supra, eliminate these error events by eliminating from the signal all sequences of three or more transitions. This expedient is a coding constraint that limits system capacity; the coding constraint limits the code rate to be below the rate 8/9. Therefore these codes incur increased code rate loss at high linear densities, as Z. Kern et al. demonstrate in "Experimental Performance Comparison of FTD/DFE Detectors: 8/9 (0,k) vs. 4/5 MTR Codes," INTERMAG 97.

The codes proposed in P. Siegel et al. and W. Bliss, supra, overcome this code rate limitation by allowing sequences of three transitions at only specified locations within each code word. Tribits are allowed to start on either odd-numbers bits or even-numbered bits, but not both. This approach increases the minimum observed distance between sequences at the detector. The codes proposed in P. Siegel et al. and some of the codes of W. Bliss achieve a code rate of 8/9 by coding in blocks of 16 user bits translated to 18 channel bits. These codes allow tribits but allow no sequences of four transitions (quadbits) or more. However, the coding schemes utilizing relatively long 18-bit block lengths have encoders, decoders, serializers, and deserializers which are relatively complex. Additionally, substantial path memory at the detector is required to insure reliable decisions. When more probable errors occur at boundaries between code words, the worst-case error propagation is 4 user bytes.

In many EPRML and E²PRML storage systems, the means of coding data to be recorded is via an encoder followed by a precoder, as in the system proposed by Bliss, supra. The encoder output and the precoder input sequence is in binary non-return to zero inverse (NRZI) notation, where a 1 designates the recording of a transition (such as a magnetic transition) and a 0 represents the lack of a transition. The precoder output and channel input is in binary non-return to zero (NRZ) notation, where a 0 represents one level (such as one level of magnetic saturation) and a 1 represents the opposite level. The precoder has transfer function, $f(D) = 1/(1 \oplus D)D)$, where the symbol $\oplus$ represents XOR, i.e., exclusive OR.

The terms EPRML and E²PRML have been applied to EPR4 and E²PR4 systems of the general type that this invention concerns. The additional letters "ML" indicate that the system includes a Maximum Likelihood detector. It should be appreciated, however, that the systems of the present invention involve a combination of trellis coding and additional channel constraints in a maximum likelihood detector.

A need exists for a trellis coded EPRML or E²PRML system functionally similar to the MTR code systems and at the same time avoiding the increased code rate loss at high linear densities, occurring when those systems exclude all tribits, as in the kind of system proposed by Moon et al., supra. A need also exist for codes of this type which utilize relatively short block lengths, to permit use of simpler encoders, decoders, serializers, and deserializers than those required when using the coding approaches of systems such as those proposed in P. Siegel et al. and the 16/18 codes of W. Bliss. In addition, a need exists for codes which utilize relatively short block lengths to reduce error propagation at code word boundaries to a value below 4 user bytes. Further, a need ezists for coding approaches that will require less path memory to insure reliable decisions at the detector.

SUMMARY OF THE INVENTION

The present invention disclosed in this patent application provides one or more solutions which fulfill these needs, as well as others described below, by providing a new code with distance properties generally similar to those of P. Siegel et al., so that some tribits are allowed but no longer sequences of consecutive transitions are allowed. The instant system utilizes certain allowed locations of tribits within each codeword. However, the instant system utilizes different allowed locations of tribits within each code word than P. Siegel et al. do, thereby providing what is considered superior functionality to that of such codes. A code rate 8/9 is provided here for EPR4 and $E^2PR4$ channels and the system independently maps 8-bit blocks of user data to 9-bit channel sequences.

The following description of the system of the invention uses the notation and terminology for distance spectra described in S. Altekar etal., "Distance Spectra for PRML Channels," Intermag 97. The system encoding utilizes an encoder followed by a precoder. A signal sequence S of 8-bit user bytes is fed to an encoder. The encoder produces 9-bit binary subsequence signals (0s and 1s). These signals are fed to a serializer where they are serialized to produce a precoder input signal sequence u(D) and this is fed into a precoder. The precoder outputs a binary channel input sequence, x(D). The channel input x(D) is transmitted or is recorded on a transmission medium (both of which are referred to here as a channel), and is subject to noise contamination. A receiver or read element recovers a possibly noisy channel output response.

In a preferred system considered here, the channel is equalized to a target partial response transfer function of EPR4 or $E^2PR4$, with partial response polynomial p(D). Therefore, the sampled output of the channel without noise can be expressed as y(D), where y(D) is the product of x(D) and p(D). When the channel is in fact corrupted by noise, the received sample response can be expressed as r(D)=y(D)+n(D), where n(D) represents the sampled contribution of noise. Accordingly, r(D)=x(D) p(D)+n(D).

Received signal r(D), as possibly so corrupted by noise, is fed to a Viterbi detector. The detector forms a maximum likelihood estimate x'(D) of precoder output x(D). The resulting signal is input to an inverse precoder function, 1⊕D, to yield an estimate u'(D) of precoder input signal u(D). Then signal u'(D) is fed to a deserializer. The signal is deserialized into 9-bit subsequences, which are fed to a decoder and decoded to produce an estimate of the 8-bit data bytes, as reconstructed to be freed from noise corruption.

The resulting output signal S' is representative of input signal S, despite the imposition of noise corruption during transmission.

The encoding protocol of the invention is implemented in the encoder. The protocol is: no sequence of 4 consecutive transitions occurs in any 9-bit codeword; no 9-bit codeword ends with a sequence of 2 or more consecutive transitions; no 9-bit codeword begins with more than 2 consecutive transitions; and sequences of 3 consecutive transitions, if any, begin only on a 2nd, 4th, 6th, or 9th bit of said 9-bit codeword. The foregoing protocol is augmented by the following additional constraint, to limit quasi-catastrophic behavior: no precoded 9-bit codeword has the same 1st, 3rd, 5th, 7th, and 9th bit in NRZ notation. Other limitations on coding and limitations imposed in the detector, are described to enhance the performance of the system.

DESCRIPTION OF DRAWINGS

FIG. 4 represents the first three bits in a coded block, while FIGS. 5 and 6 represent the fourth through sixth bits, and seventh through ninth bits, of a coded block, respectively.

FIG. 7 represents the first three bits in a coded block, while FIGS. 8 and 9 represent the fourth through sixth bits, and seventh through ninth bits, of a coded block, respectively.

DETAILED DESCRIPTION OF THE INVENTION

Figure 1:
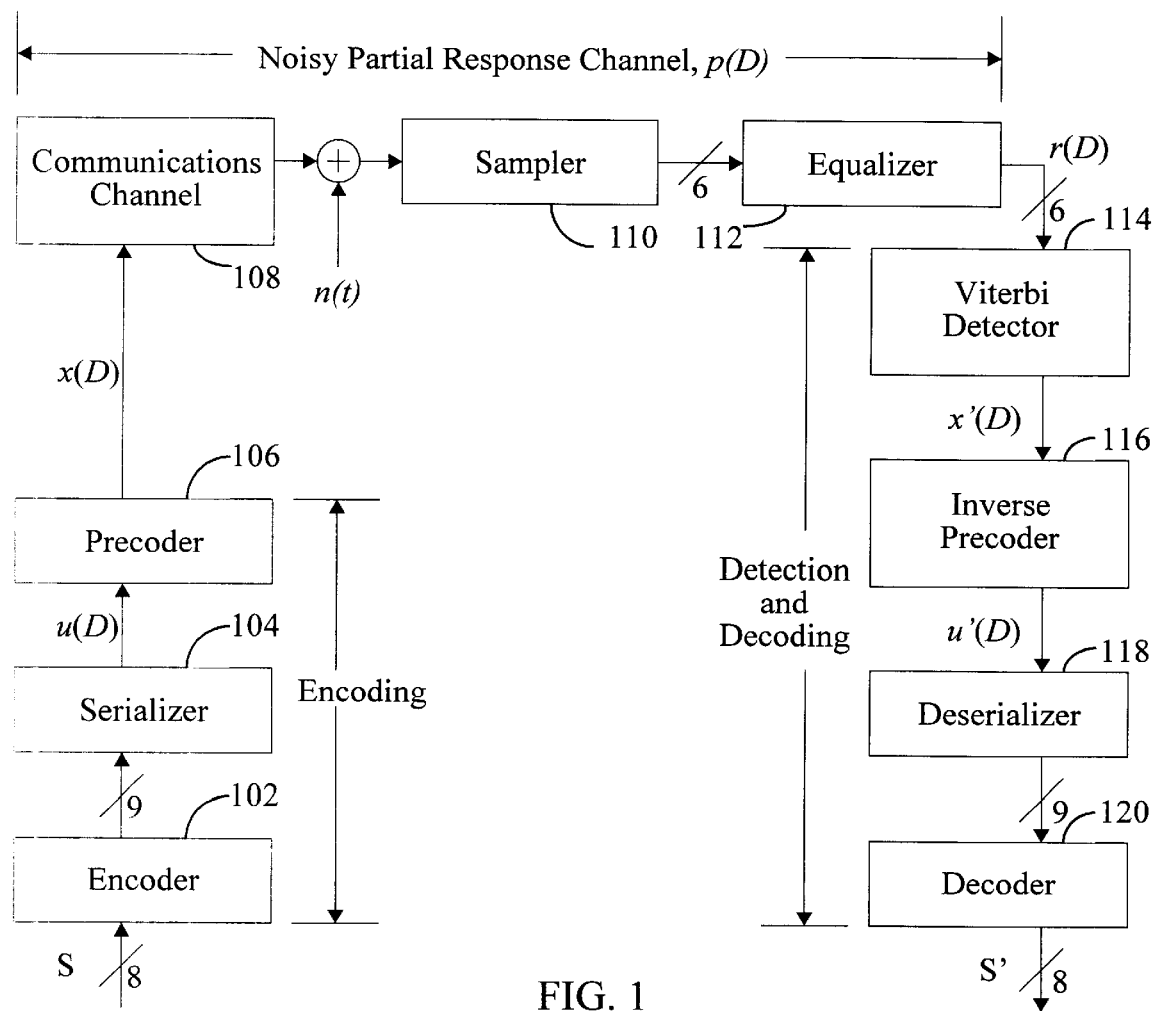
FIG. 1 is a system block diagram for a preferred embodiment of the present invention.

Referring to FIG. 1, a system block diagram in accordance with a preferred embodiment of the present invention is shown. In FIG. 1, an input data byte stream S enters Encoder 102 on an 8 bit bus. Encoder 102 outputs a 9 bit subsequence consisting of the next 9 channel inputs in NRZI notation, where a 1 designates a transition to be recorded, and a 0 designates that no transition is to be recorded. The output of Encoder 102 is input to Serializer 104, which serially outputs these nine bit subsequences to produce the encoded data sequence u(D). The output of Serializer 104 is input to Precoder 106, which converts the NRZI serial stream u(D) to a serial stream x(D) in NRZ notation, where a 1 designates one direction of polarity to be recorded or transmitted, while a 0 designates the opposite polarity, through the precoder transfer function $$f(D)=1/(1 \oplus D)$$

as described previously. The NRZ sequence is recorded to or transmitted over Communications Channel 108.

In the preferred application, Communications Channel 108 consists of a magnetic disk recorder, with magnetic recording (writing) and sensing (reading) heads. Typically, the output of Precoder 106 is input to an amplifier which supplies current to drive an inductive write element in a magnetic head to locally change the polarity of magnetization on a magnetic disk. A magnetic disk recorder typically also contains a Magneto-Resistive (MR) sensor which can be used to sense the local polarity on the magnetic disk. When the input data is to be read back, the MR sensor is typically amplified and corrupted by additive noise.

This possibly noisy analog signal is input to Sampler 110. Sampler 110 typically contains a variable gain amplifier, analog shaping and noise reduction filters, a means of timing recovery, and an analog to digital converter. The output of Sampler 108 is typically a stream of 6 bit digital values, which are output on a bus to Equalizer 112. Equalizer 112 provides additional equalization as required to approximate the desired partial response channel p(D), preferably EPR4 or $E^2$PR4. In the absence of noise, the system is designed so that the typically 6 bit output of Equalizer 112, r(D), is approximately equal to the product x(D) p(D).

Viterbi Detector 114 processes the outputs of Equalizer 112 to develop a maximum likelihood estimate, x'(D), of the channel input sequence x(D). This estimate is input to inverse Precoder 116, which has transfer function $$f^{-1}(D)=1 \oplus D$$

and is used to produce an estimate u'(D) of the serialized encoder output sequence u(D). The estimated serial encoder output is framed into 9 bit subsequences in Deserializer 118, which produces an estimate of the 9 bit parallel output of the encoder. Finally, Decoder 120 uses this 9 bit bus as input to an inverse encoder function, which outputs an estimate of the 8 bit data byte. The resulting output signal S' from decoder 120 is representative of input signal S, despite the possible imposition of noise corruption during transmission.

In theory, one could use software for coding purposes. But as a practical matter it is considered preferable to use integrated circuits to perform the encoding and precoding operations rather than software, because of the need for speed with the high signal throughput that is anticipated in this operation. Accordingly, the instant system preferably utilizes area-efficient combinatorial logic to implement these operations in a high speed manner.

The invention is readily adapted to any system in which information is transmitted via a path subject to possible corruption, where the path is one with a natural response that can be equalized (such as by shaping filters) to EPR4 or $E^2$PR4 without excessive noise enhancement. As will appear below, the coding system is most appropriate where the channel has dominant error events, as a result of noise coloration and inter-symbol interference, consisting of a failure to detect long strings of consecutive transitions.

Viterbi detector 114 forms a maximum likelihood estimate signal x'(D) by decoding procedures in accordance with the standard Viterbi algorithm procedure for time varying trellises, as specially adapted to the present invention. (For a general description of decoding via the standard Viterbi algorithm, see the '489 patent, supra.) The special adaptations for the present invention are illustrated diagrammatically in FIGS. 2–9. In each of these digraphs, the allowed channel states, consisting of the most recent NRZ input bits to the channel at a given time instant, are represented by the vertices in a given column of the directed graph. Time flows from left to right in the graphs, with state transitions represented by edges corresponding to possible channel input bits. In these decoder structures, branch metrics are calculated which are related to the conditional probability of observing the current sample given a possible channel state and channel input bit. The branch metric for a given edge is added to the state metric for the state at the source of the edge to create a path metric. All paths terminating in a given state are compared, and the path with minimum metric is selected as the most likely path into that state. This recursive operation is known as the add-compare-select (ACS) of the Viterbi algorithm, and has been shown to generate a maximum likelihood estimate x'(D) of the channel input x(D).

The problem which the system addresses is to define appropriate configurations that will control error events and eliminate them. Referring again to S. Altekar et al., "Distance Spectra for PRML Channels," Intermag 97, define the precoder error sequence as $$e_u(D)=u(D)-u'(D),$$

the channel input error sequence as $$e_x(D)=x(D)-x'(D),$$

and the corresponding channel output error sequence as $$e_y(D)=y(D)-y'(D).$$

An error event λ is said to extend from times t=m to t=n if each of the following three conditions are met:
1. $e_{x,m-t}=0$ for all t such that $0<m<\deg[p(D)]$
2. $e_{x,m} \neq 0$
3. n is the smallest value of t such that $t \geq m$ and $e_{x,t-j}=0$ for all values of j such that $0<j \leq \deg[p(D)]$.

The squared distance of the error event is then given by the formula $$d^2(\lambda) = \sum_{k=m}^{n} (e_{y,k})^2.$$

This leads to the development of three families of error events e, which, together with their inverses, are of particular interest here. They are:

0 0 0+1−1[+1−1] 0 0 0, 0 0 0+1[−1+1] 0 0 0, and 0 0 0+1[0+1] 0 0 0.

Each of these error events contains a sequence designated [m n], where m and n can be −1,0, or +1. This notation is used to represent families of error events that have the pattern mn one time or several times in succession. According to S. Altekar et al., supra, these three error event families will be the only ones of squared distance 4 on EPR4 channels. According to R. Karabed et al., "Analysis of error sequences for PRML and EPRML signaling performed over Lorentzian channel," GLOBECOM 96, pp. 368–373, the first and second of the above listed error event families are the dominant error events on Lorentzian channels equalized to EPR4. According to P. Siegel et al., supra, elimination of the first and second of the above listed error event families will eliminate all events of minimum squared distance 6 on $E^2$PR4 channels. The event +1−1+1 0 0+1−1 is the only event of distance 8 on $E^2$PR4 channels; this event is also eliminated by the constraints of the present invention. The present invention desirably increases the minimum squared distance of 6 on $E^2$PR4 channels to a minimum squared distance of 10. In the encoding protocol of this invention, the first and second of the above listed error event families are eliminated through coding and detector constraints, and the length of the third of the above listed error event families is limited. The procedure for accomplishing this is now described.

Turning to the first of these families, 0 0 0+1−1[+1−1] 0 0 0, it will be appreciated that for such an error event to occur the detector must make an error in distinguishing the following NRZ channel input sequences, A B C 1 0[1 0] D E F and A B C 0 1[0 1] D E F, where A, B, C, D, E, F represent arbitrary channel input bits. The NRZI channel input bits corresponding to the foregoing contain the subsequences, $\overline{C}$1[1 1] D and C1[1 1] $\overline{D}$ where barred symbols $\overline{C}$ and $\overline{D}$ represent the binary complements of C and D, respectively, starting at the fourth input bit. At least one of these sequences will contain a quadbit, i.e., 4 consecutive transitions (1s in NRZI notation). The code protocol of this invention eliminates all quadbits, and thus makes this event impossible.

Turning next to the second of these families, 0 0 0+1[−1+1] 0 0 0, it will be appreciated that for such an error event to occur the detector must make an error in distinguishing the following NRZ channel input sequences:

A B C 1[1 0] D E F and A B C 0[0 1] D E F, where A, B, C, D, E, F again represent arbitrary channel input bits. The NRZI channel input bits corresponding to the foregoing contain the subsequences, $\overline{C}$[1 1] D and C[1 1] $\overline{D}$, respectively, starting at the fourth input bit. Unless C and D are equal, one of these sequences will necessarily contain a quadbit. However, this error is not possible because the encoding protocol prohibits all quadbits. In addition, if C equals D, a sequence of 3 consecutive transitions (a tribit) will be mistakenly detected as beginning one bit earlier or one bit later than the channel input tribit. The present invention constrains the locations of tribits, so that when any tribit begins at time i, no tribits are allowed to begin at times i−1 or i+1. Accordingly, the invention makes this event impossible.

In summary, the foregoing considerations impose the following codeword constraints on each subsequence of 9 precoder input bits (using NRZI notation):

(a) no sequence of 4 consecutive transitions occurs in any 9-bit codeword, (b) no 9-bit codeword ends with a sequence of 2 or more consecutive transitions, (c) no 9-bit codeword begins with more than 2 consecutive transitions, and (d) sequences of 3 consecutive transitions, if any, begin only on a 2nd, 4th, 6th, or 9th bit of said 9-bit codeword.

Although no specific constraint described above includes it, other aspects of the encoding scheme (described below) have the result that, in addition, each 9-bit codeword contains at least 1 transition.

The four above-listed code constraints (a)–(d) result in the following list of 267 available sequences for 8-bit encoding, in NRZI notation.

TABLE A 267 trellis sequences in NRZI notation

| | | | | | | | |
|---|---|---|---|---|---|---|---|
| 000000000 | 000000001 | 000000010 | 000000100 | 000000101 | 000000110 | 000001000 | 000001001 |
| 000001010 | 000001100 | 000001101 | 000001110 | 000010000 | 000010001 | 000010010 | 000010100 |
| 000010101 | 000010110 | 000011000 | 000011001 | 000011010 | 000100000 | 000100001 | 000100010 |
| 000100100 | 001001010 | 000100110 | 000101000 | 000101001 | 000101010 | 000101100 | 000101101 |
| 000101110 | 000110000 | 000110010 | 000110100 | 000110101 | 000110110 | 000110101 | 000111000 |
| 000111001 | 000111010 | 001000000 | 001000001 | 001000010 | 001000100 | 001000101 | 001000110 |
| 001001000 | 001001001 | 001001010 | 001001100 | 001001101 | 001001110 | 001010000 | 001010001 |
| 001010010 | 001010100 | 001010101 | 001010110 | 001011000 | 001011001 | 001011010 | 001100000 |
| 001100001 | 001100010 | 001100100 | 001100101 | 001100110 | 001101000 | 001101001 | 001101010 |
| 001101100 | 001101101 | 001101110 | 010000000 | 010000001 | 010000010 | 010000100 | 010000101 |
| 010000110 | 010001000 | 010001001 | 010001010 | 010001100 | 010001101 | 010001110 | 010010000 |
| 010010001 | 010010010 | 010010100 | 010010101 | 010010110 | 010011000 | 010011001 | 010011010 |
| 010100000 | 010100001 | 010100010 | 010100100 | 010100101 | 010100110 | 010101000 | 010101001 |
| 010101010 | 010101100 | 010101101 | 010101110 | 010110000 | 010110001 | 010110010 | 010110100 |
| 010110101 | 010110110 | 010111000 | 010111001 | 010111010 | 011000000 | 011000001 | 011000010 |
| 011000100 | 011000101 | 011000110 | 011001000 | 011001001 | 011001010 | 011001100 | 011001101 |
| 011001110 | 011010000 | 011010001 | 011010010 | 011010100 | 011010101 | 011010110 | 011011000 |
| 011011001 | 011011010 | 011100000 | 011100001 | 011100010 | 011100100 | 011100101 | 011100110 |
| 011101000 | 011101001 | 011101010 | 011101100 | 011101101 | 011101110 | 100000000 | 100000001 |
| 100000010 | 100000100 | 100000101 | 100000110 | 100001000 | 100001001 | 100001010 | 100001100 |
| 100001101 | 100001110 | 100010000 | 100010001 | 100010010 | 100010100 | 100010101 | 100010110 |
| 100011000 | 100011001 | 100011010 | 100100000 | 100100001 | 100100010 | 100100100 | 100100101 |
| 100100110 | 100101000 | 100101001 | 100101010 | 100101100 | 100101101 | 100101110 | 100110000 |
| 100110001 | 100110010 | 100110100 | 100110101 | 100110110 | 100111000 | 100111001 | 100111010 |
| 101000000 | 101000001 | 101000010 | 101000100 | 101000101 | 101000110 | 101001000 | 101001001 |
| 101001010 | 101001100 | 101001101 | 101001110 | 101010000 | 101010001 | 101010010 | 101010100 |
| 101010101 | 101010110 | 101011000 | 101011001 | 101011010 | 101100000 | 101100001 | 101100010 |
| 101100100 | 101100101 | 101100110 | 101101000 | 101101001 | 101101010 | 101101100 | 101101101 |
| 101101110 | 110000000 | 110000001 | 110000010 | 110000100 | 110000101 | 110000110 | 110001000 |
| 110001001 | 110001010 | 110001100 | 110001101 | 110001110 | 110010000 | 110010001 | 110010010 |
| 110010100 | 110010101 | 110010110 | 110011000 | 110011001 | 110011010 | 110100000 | 110100001 |
| 110100010 | 110100100 | 110100101 | 110100110 | 110101000 | 110101001 | 110101010 | 110101100 |
| 110101101 | 110101110 | 110110000 | 110110001 | 110110010 | 110110100 | 110110101 | 110110110 |
| 110111000 | 110111001 | 110111010 | | | | | |

A preferred embodiment of this code improves run lengths by imposing additional constraints on the number of permissible beginning and ending 0s in any codeword, and by limiting the length of possible error events in the third of the above-listed error families. This eliminates another 11 sequences and results in a preferred subset of 256 sequences (Table B, below).

An error event of the third family listed above, 0 0 0+1[0+1] 0 0 0, if the event is of unlimited length, can create quasi-catastrophic behavior in a trellis-coded EPR4 or E²PR4 Viterbi detector with limited path memory. For such an error event to occur, a coded sequence must contain an even or odd numbered substream of same consecutive input symbols in NRZ notation. A further codeword constraint is needed to prevent such events. Examination of the trellis sequences of Table A shows that 001100110 and 110011001, which are complements, are the only NRZI sequences that contain an even or odd numbered substream of same consecutive input symbols in NRZ notation. These sequences are eliminated from the codeword list of Table A in the preferred subset of Table B.

A preferred embodiment also eliminates sequences with a long run of beginning 0s or ending 0s. Thus, all sequences in Table A that begin with seven or more 0s are eliminated, and so too are all sequences that end with six or more 0s, using NRZI notation. As a result the longest string of NRZI 0s in a string of concatenated codewords becomes eleven 0s, which can occur if a codeword ending in five 0s is concatenated with a codeword beginning with six 0s. The effect of this elimination of sequences is that no 9-bit codeword exists that fails to contain at least 1 transition, since eliminating any codeword that begins with seven NRZI 0s eliminates the all-0 codeword.

These additional constraints result in the following list, shown in Table B, of 256 available sequences for 8-bit encoding, in NRZI notation.

tion. Possible ending edges for tribits are indicated by bold edges and bold arrows. Each state is labelled internally with bits in NRZ notation.

Figure 2:
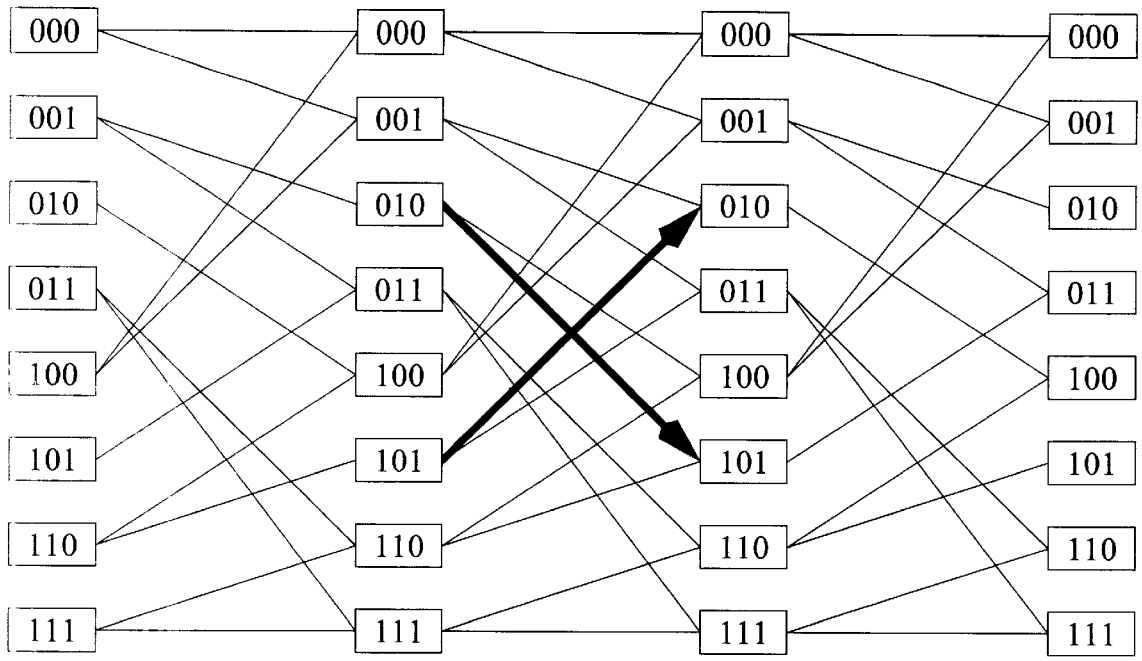
FIG. 2 is a digraph of maximal interconnection of trellis code EPR4 for three consecutive bits in accordance with a preferred embodiment of the present invention.

FIG. 2 represents a trellis structure for EPR4 showing maximal interconnection for three consecutive bits. Code constraint (d), above, is that sequences of 3 consecutive transitions, if any, begin only on a 2nd, 4th, 6th, or 9th bit of said 9-bit codeword. Thus the first and third bit interconnection eliminates these paths. In FIG. 2, each state is labelled with three bits in NRZ notation representing the last three inputs to the channel at time i. Thus a label 100 represents the following channel inputs at time i: $x_i=0$, $x_{i-1}0$, and $x_{i-2}=1$. The edge connecting state 100 at time i to state 001 at time i+1 implies a new NRZ input bit 1, with input to the channel $x_{i+1}=1$. Since the noiseless output of an EPR4 channel at time i+1 is given by $$y_{i+1}=x_{i+1}+x_i-x_{i-1}-x_{i-2},$$

the channel inputs and noiseless outputs are implied by the channel state labelling. The deleted edges in the first and third state interconnection would otherwise connect state 010 to state 101, and state 101 to state 010.

A Viterbi detector which incorporates the code and channel constraints operates in a time-varying fashion, as explained in the '489 patent, supra. A computation unit for the state 010 (101) normally adds the state metric for previous state 101 (010) to the branch metric associated with the state transition 101-010 (010-101) to get one of two path metrics; the other path metric is obtained by adding the state metric for previous state 001 (110) to the branch metric associated with the state transition 001-010 (110-101). In normal operation for EPR4, these two path metrics are

TABLE B 256 non-quasi-catastrophic sequences of preferred run lengths

| | | | | | | | |
|---|---|---|---|---|---|---|---|
| 000000100 | 000000101 | 000000110 | 000001000 | 000001001 | 000001010 | 000001100 | 000001101 |
| 000001110 | 000010000 | 000010001 | 000010010 | 000010100 | 000010101 | 000010110 | 000011000 |
| 000011001 | 000011010 | 000100000 | 000100001 | 000100010 | 000100100 | 000100101 | 000100110 |
| 000101000 | 000101001 | 000101010 | 000101100 | 000101101 | 000101110 | 000110000 | 000110001 |
| 000110010 | 000110100 | 000110101 | 000110110 | 000111000 | 000111001 | 000111010 | 001000001 |
| 001000010 | 001000100 | 001000101 | 001000110 | 001001000 | 001001001 | 001001010 | 001001100 |
| 001001101 | 001001110 | 001010000 | 001010001 | 001010010 | 001010100 | 001010101 | 001010110 |
| 001011000 | 001011001 | 001011010 | 001100000 | 001100001 | 001100010 | 001100100 | 001100101 |
| 001101000 | 001101001 | 001101010 | 001101100 | 001101101 | 001101110 | 010000001 | 010000010 |
| 010000100 | 010000101 | 010000110 | 010001000 | 010001001 | 010001010 | 010001100 | 010001101 |
| 010001110 | 010010000 | 010010001 | 010010010 | 010010100 | 010010101 | 010010110 | 010011000 |
| 010011001 | 010011010 | 010100000 | 010100001 | 010100010 | 010100100 | 010100101 | 010100110 |
| 010101000 | 010101001 | 010101010 | 010101100 | 010101101 | 010101110 | 010110000 | 010110001 |
| 010110010 | 010110100 | 010110101 | 010110110 | 010111000 | 010111001 | 010111010 | 011000001 |
| 011000010 | 011000100 | 011000101 | 011000110 | 011001000 | 011001001 | 011001010 | 011001100 |
| 011001101 | 011001110 | 011010000 | 011010001 | 011010010 | 011010100 | 011010101 | 011010110 |
| 011011000 | 011011001 | 011011010 | 011100000 | 011100001 | 011100010 | 011100100 | 011100101 |
| 011100110 | 011101000 | 011101001 | 011101010 | 011101100 | 011101101 | 011101110 | 100000001 |
| 100000010 | 100000100 | 100000101 | 100000110 | 100001000 | 100001001 | 100001010 | 100001100 |
| 100001101 | 100001110 | 100010000 | 100010001 | 100010010 | 100010100 | 100010101 | 100010110 |
| 100011000 | 100011001 | 100011010 | 100100000 | 100100001 | 100100010 | 100100100 | 100100101 |
| 100100110 | 100101000 | 100101001 | 100101010 | 100101100 | 100101101 | 100101110 | 100110000 |
| 100110001 | 100110010 | 100110100 | 100110101 | 100110110 | 100111000 | 100111001 | 100111010 |
| 101000001 | 101000010 | 101000100 | 101000101 | 101000110 | 101001000 | 101001001 | 101001010 |
| 101001100 | 101001101 | 101001110 | 101010000 | 101010001 | 101010010 | 101010100 | 101010101 |
| 101010110 | 101011000 | 101011001 | 101011010 | 101100000 | 101100001 | 101100010 | 101100100 |
| 101100101 | 101100110 | 101101000 | 101101001 | 101101010 | 101101100 | 101101101 | 101101110 |
| 110000001 | 110000010 | 110000100 | 110000101 | 110000110 | 110001000 | 110001001 | 110001010 |
| 110001100 | 110001101 | 110001110 | 110010000 | 110010001 | 110010010 | 110010100 | 110010101 |
| 110010110 | 110011000 | 110011010 | 110100000 | 110100001 | 110100010 | 110100100 | 110100101 |
| 110100110 | 110101000 | 110101001 | 110101010 | 110101100 | 110101101 | 110101110 | 110110000 |
| 110110001 | 110110010 | 110110100 | 110110101 | 110110110 | 110111000 | 110111001 | 110111010 |

Referring now to FIGS. 2–9, trellis structures are shown using a conventional method for their pictorial representacompared, and the minimum metric is selected as the new metric for state 010 (101). The path history for state 010

(101) is obtained by using the metric select signal to select which of the previous path histories for state 101 (010) or state 001 (110) is appended with a bit to become the new path history. This computational unit is commonly referred to as an add-compare-select (ACS) unit.

When incorporating the code constraint, as in the first or third bit interconnection of FIG. 2, the metric select signal is pre-biased so that it ignores the output of the comparator, and chooses a pre-selected path. This can be accomplished by inserting a 2 input muliplexor (MUX) between the comparator output and the metric select signal, as in the '489 patent, supra. The MUX enables the comparator output in normal operation, but in pre-biasing, it enables the other input, which is derived as a combinatorial function of the output of a position counter of the interconnect number within each code block of nine bits. This logic can be designed to pre-select any desired edges within each code block.

Figure 3:
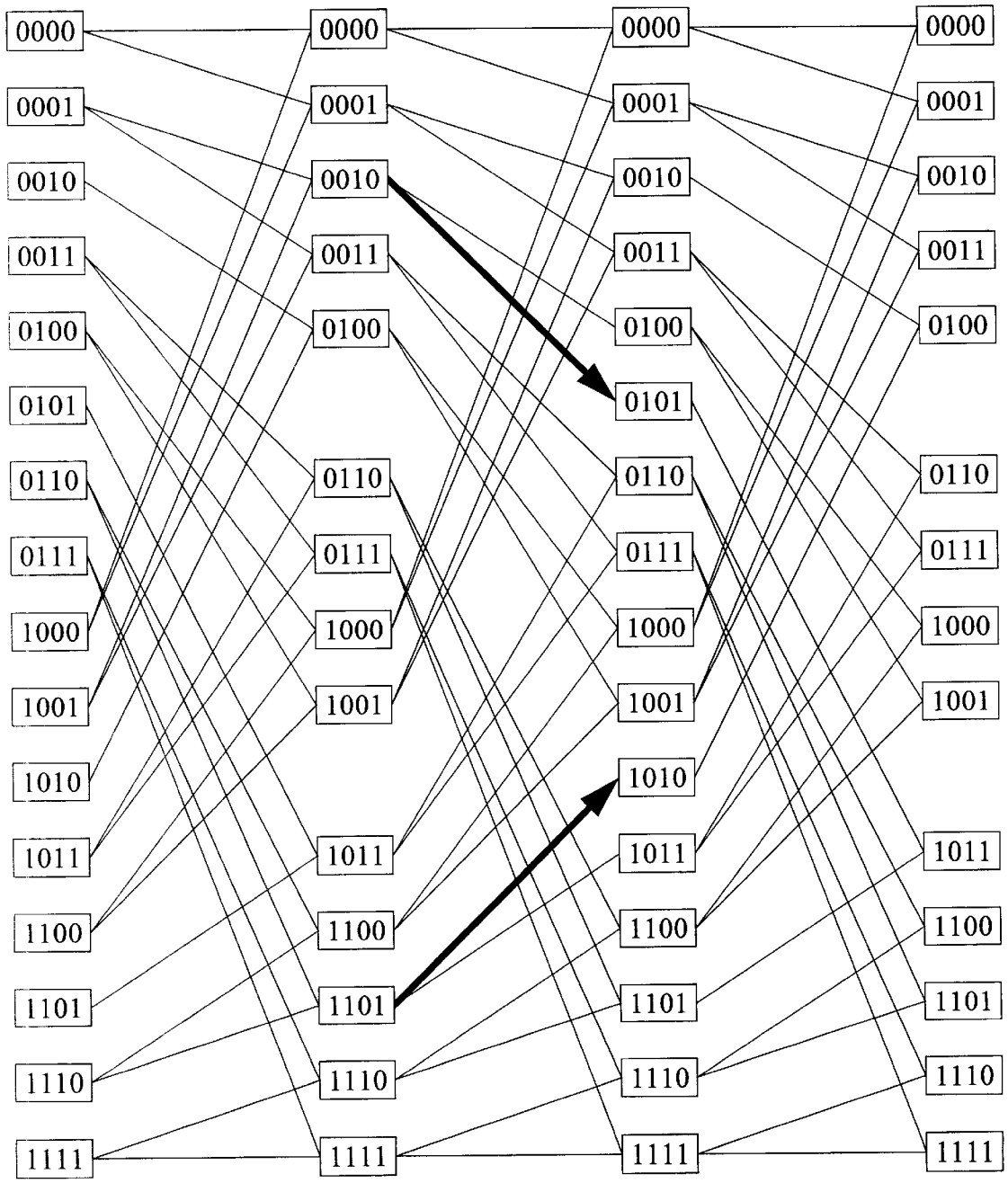
FIG. 3 is a digraph of maximal interconnection of trellis code $E^2PR4$ for three consecutive bits in accordance with a preferred embodiment of the present invention.

FIG. 3 shows a trellis structure for $E^2PR4$ indicating the maximum interconnection of the $E^2PR4$ and code trellis for three consecutive bits. The states are labelled with the four previous channels bits in NRZ notation in a manner similar to FIG. 2. This labelling implies the current input bit and noiseless sample associated with each edge. Possible ending edges for tribits are indicated by bold edges with arrowheads. The interconnection between state 0101 (1010) and state 1010 (0101) is never allowed, since this would constitute a fourth consecutive transition and the code scheme does not allow such quadbits. The state interconnection between state 0010 (1101) and state 0101 (0010) constitutes a third consecutive transition. Since tribits at consecutive locations are not allowed by the code, the first and third bit interconnection eliminates these two paths, and there is no path to the state 0101 (1010) at these times, which eliminates two of the channel states in a time-varying fashion.

Figure 4:
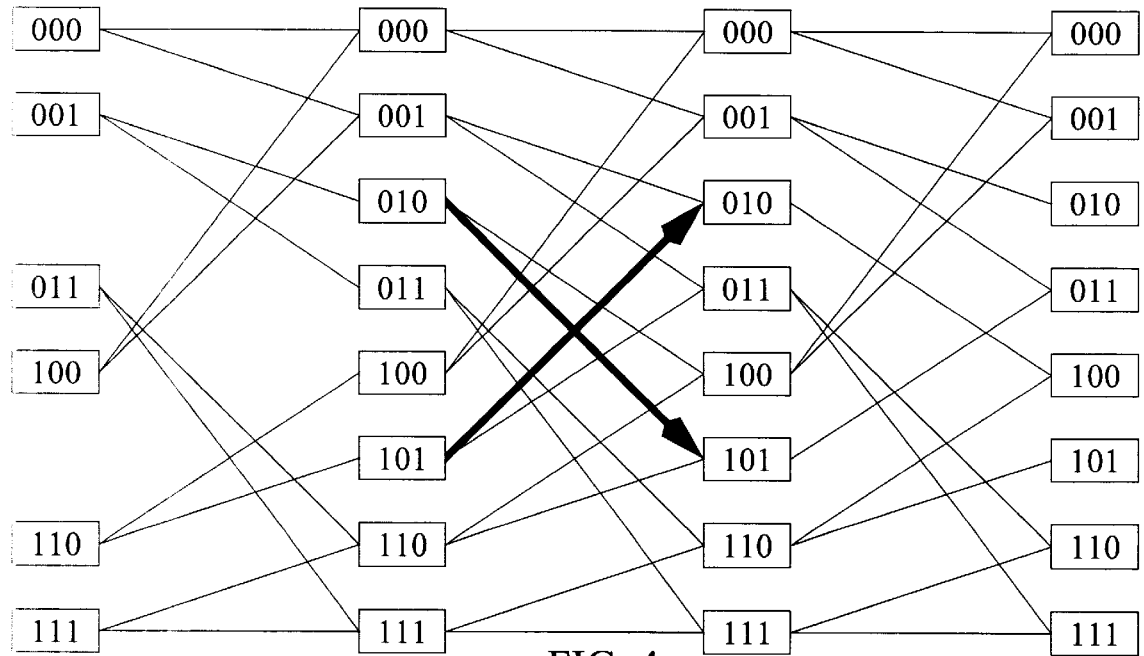
FIGS. 4–6 represent a trellis-coded EPR4 digraph showing interconnection for a coded block of nine consecutive bits. These figures divide a block of nine consecutive bits into three parts for improved clarity.
Figure 5:
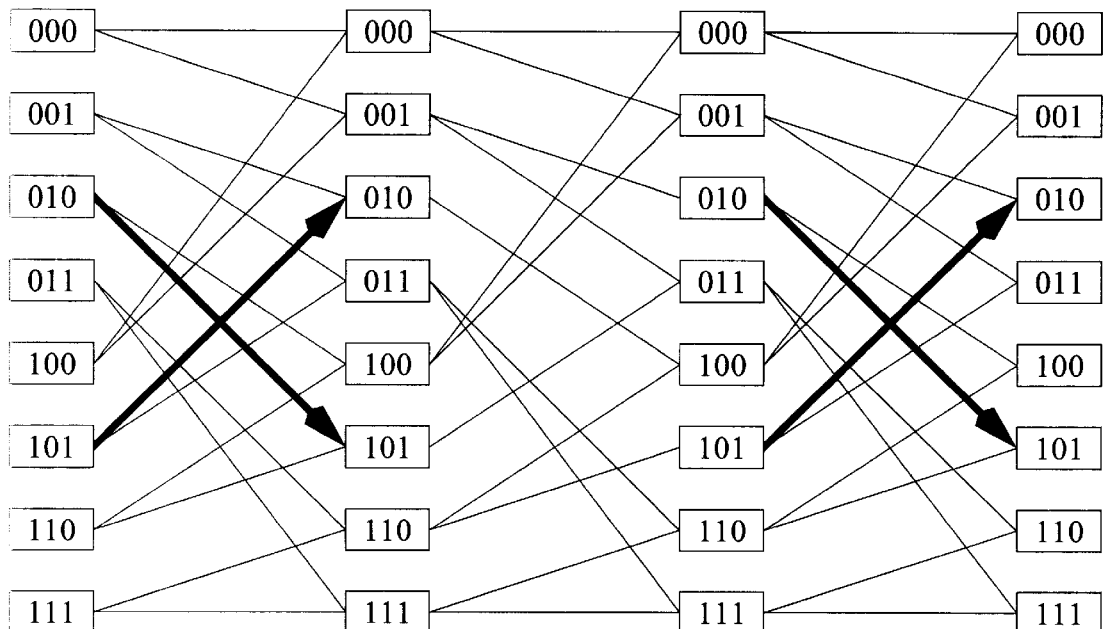
Figure 6:
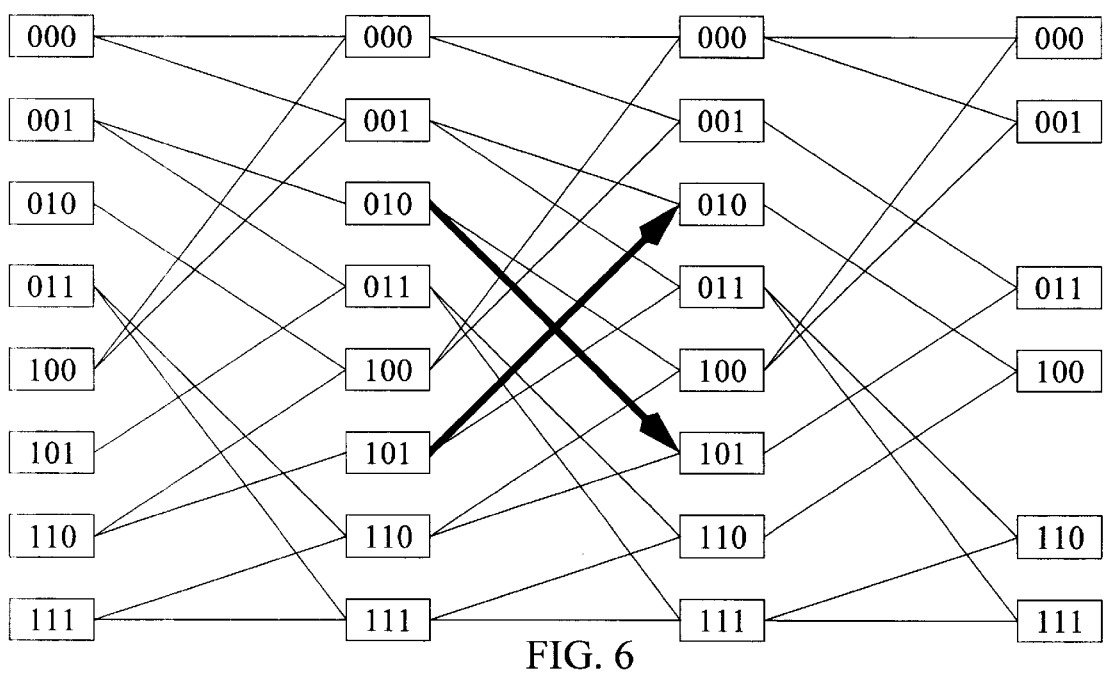

FIG. 4 shows a trellis diagram which includes the code and channel constraints for the first three bits in a block of 9 channel bits for EPR4. FIG. 5 shows the detector state and branch interconnection for the central three bits in a block of 9 channel input bits, while FIG. 6 shows these for the last three bits of a block of 9 channel input bits. A repeating sequence of the constraints imposed by FIGS. 4, 5, and 6 in succession provides all of the constraints imposed in the detector in synchronization with the 9 bit code block boundaries for EPR4.

Figure 7:
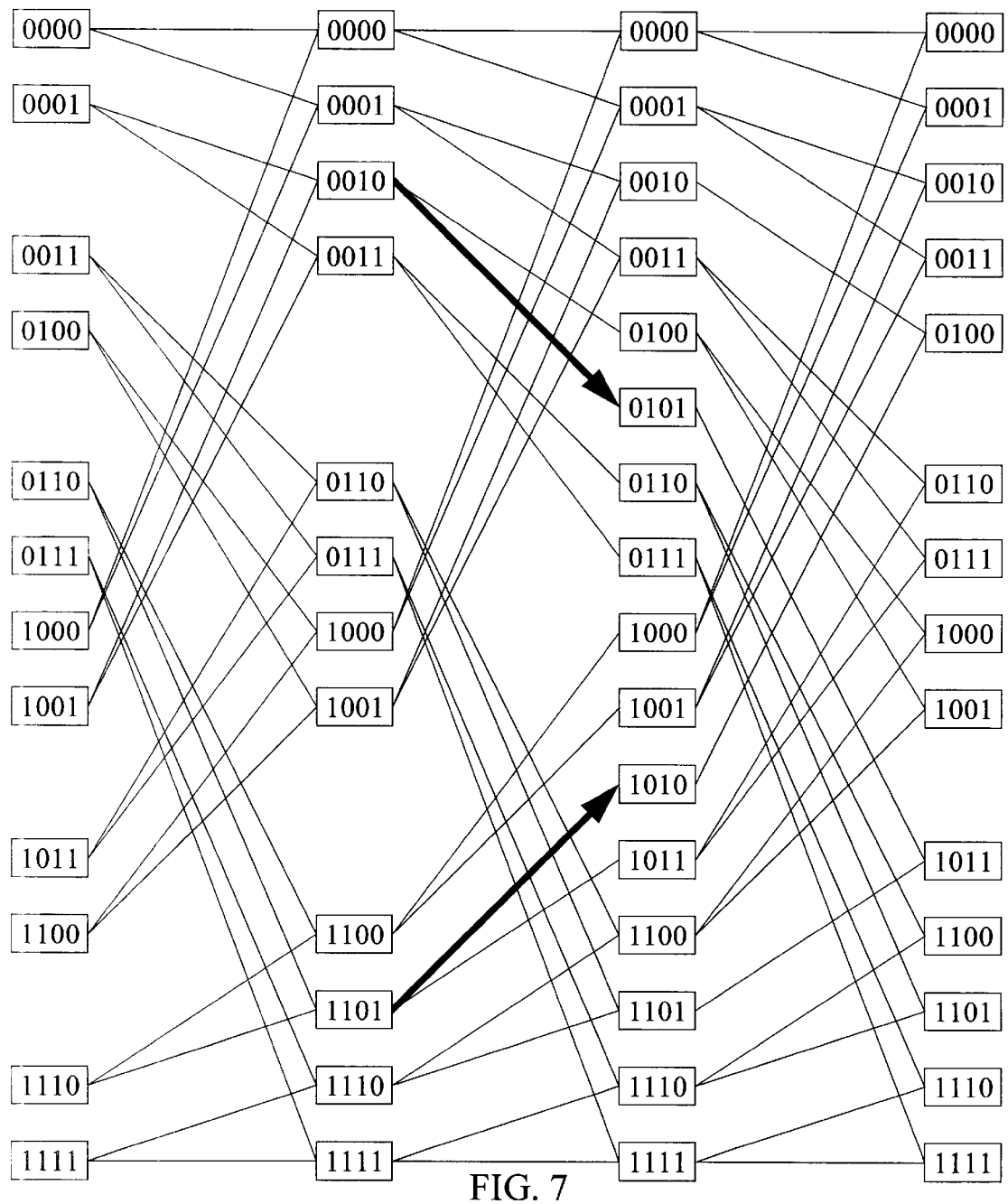
FIGS. 7–9 is a trellis-coded $E^2PR4$ digraph showing interconnection for a coded block of nine consecutive bits. Like FIGS. 4–6, the figures divide a block of nine consecutive bits into three parts for improved clarity.
Figure 8:
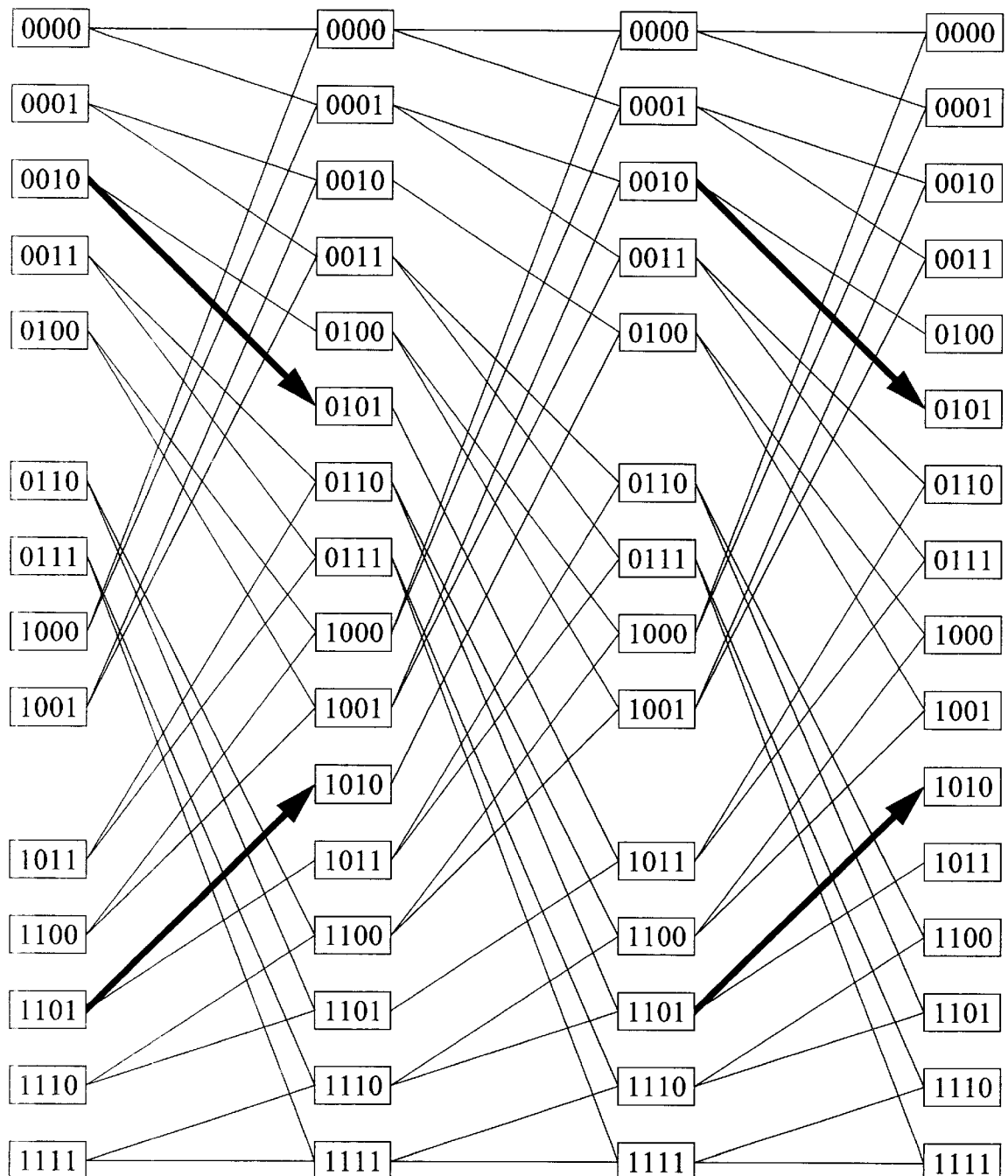
Figure 9:
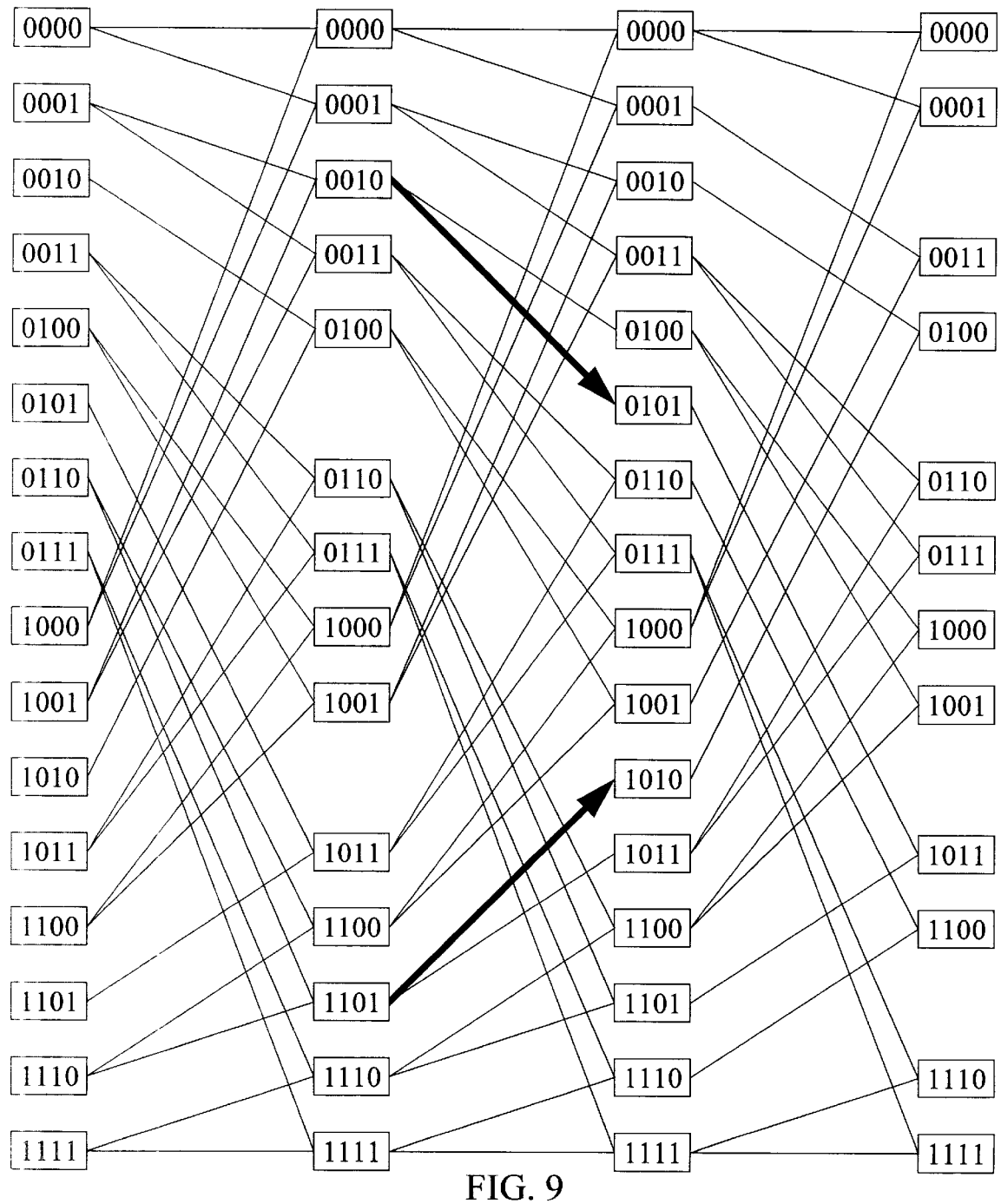

FIGS. 7, 8, and 9 are similar graphs for code blocks on $E^2PR4$ channels, and each code block period of 9 channel bits is similarly split into the first three bits (FIG. 7), the center three bits (FIG. 8) and the last three bits (FIG. 9) for greater clarity. A repeating sequence of the constraints imposed by FIGS. 7, 8, and 9 in succession provides all of the constraints imposed in the detector in synchronization with the 9 bit code block boundaries for $E^2PR4$.

Because of the additional constraints imposed at codeword boundaries, states with two consecutive transitions can be eliminated at code block boundaries. This is shown in FIGS. 4, 6, 7, and 9. In FIGS. 4 and 6, the states 010 and 101 are unused by the code at code block boundaries, and eliminated, unlike the detector considered in Bliss, supra. It is considered that this has practical implementation advantages, providing greater functionality. The performance of the system is advanced by this different approach (not using states 010 and 101 at code block boundaries as does a Bliss detector, and instead eliminating them) in the four following ways:

(1) The detector of the present invention is prevented from choosing an erroneous sequence which corresponds to a path through these two states, which the other approach permits.

(2) The erroneous sequence detection in the decoder is simplified in this invention relative to the other approach, because fewer erroneous sequences can enter the decoder.

(3) Fewer path memories need to be kept here after nine bits.

(4) Fewer state metrics need to be compared here at codeword boundaries to find the minimum metric state and the corresponding maximum-likelihood output of the detector.

Similarly, the states 1101 and 0010 in FIGS. 7 and 9 are eliminated at code block boundaries, with the same resulting benefits.

Hardware encoder and decoder implementations for the above-described scheme are shown in Appendices A and B, respectively. These appendices list generic VHDL source code. It is desirable to have a small gate count implementation that can easily be embodied in custom very large system integrated (VLSI) circuit. An important feature of this invention is the reduction of the code constraints to a set of logical constraints which implement the encoder and decoder operations with small area and propagation delay. The preferred implementation, and that intended for the circuitry described by Appendices A and B, is therefore an active combinatorial logic device preferably at less than 25 nanoseconds access time. The active elements of this gate array circuitry include AND gates, OR gates, and inverters, among other things.

Persons skilled in this art will appreciate that the invention may be considered to be implemented, not only in the hardware and other structures described above, but also in a tape, disk, or other storage medium encoded with a computer-readable signal that has been processed in accordance with the invention. The invention therefore extends also to:

a data signal that is manufactured (as contrasted, of course, with a naturally occurring signal) in accordance with the method of the invention; and a tangible, computer-readable medium of information storage that has been structured by encoding it with a data signal processed in accordance with the method of the invention.

The manufactured data signal referred to hereinabove can advantageously be a data signal embodied in a carrier wave. However, the principle of the invention is not limited to amplitude modulation or frequency modulation of a carrier wave. The invention may be exploited by means of pulse modulation as well, and phase modulation. The invention can also be exploited by any other method of imprinting intelligible data on electromagnetic radiation of any frequency (EMR). It is therefore considered that the invention extends to any means of transmitting intelligible information to a distanced location, where the information has first been embodied in a signal encoded according to the novel system of reducing signal corruption by noise that has been taught hereinabove. The invention is not in the modulation of EMR with information, per se, for that is the invention of Marconi, Armstrong, and others. Rather, the invention is in a combination of a novel means of reduction of noise corruption with an otherwise conventional encoding of EMR with information according to the principles which those others have taught and which others may hereafter teach, and its transmission thereafter at any distance.

By the same token, the invention extends to a data structure embodied in a tangible or intangible computer-readable medium, where the data structure is such that it is or corresponds to the structure dictated by the method of reducing noise-corruption of this invention.

The preceding description of an improved EPRML or $E^2$PRML system discloses a way to avoid the increased code rate loss at high linear densities, which occurs when Viterbi systems such that proposed by Moon et al., supra, exclude all tribits. Further, the system of this invention provides a way to utilize relatively short block lengths, and thereby to permit use of simpler encoders, decoders, serializers, and deserializers than those required when using some of the coding approaches of Viterbi systems such as those proposed in P. Siegel et al. and W. Bliss. The present invention's use of relatively short block lengths reduces error propagation at code word boundaries to a value below 4 user bytes. At the same time, the system of the invention provides a coding approach that requires less path memory to insure reliable decisions at the detector.

APPENDIX A

VHDL Source Code for Encoder

```vhdl
library ieee;
use ieee.std_logic_1164.all;
entity epre9enc is port (
    ein: in std_ulogic_vector (7 downto 0);
    eout: out std_ulogic_vector (8 downto 0));
end epr89enc;
architecture epr89enc_arc of epr89enc is
signal p0, p1, p2, p3, p4, p5, p6, p7, p8, nein1, nein0: std_ulogic;
signal p543, p210, p762, p765, z43210, p125, p12345, somep5: std_ulogic;
signal m0, m1, m2, m3, m4, m5, m6, m7, m8, m9: std_ulogic_vector (8 downto 0);
signal r0, r1, r2, r3, r4, r5, r6, r7, r8, r9: std_ulogic_vector (8 down to 0);
begin
p543<= ein(5) and ein(4) and ein(3);
p210<= ein(2) and ein(1) and ein(0);.
p762<= ein(7) and ein(6) and ein(2);
p765<= ein(7) and ein(6) and ein(5);
z43210<= not (ein(4) or ein(3) or ein(2) or ein(1) or ein(0));
p2<= p543 and p762;
p3<= p210 and p543 and not p2;
p1<= p543 and not (p2 or p3);
somep5<= p210 and ((not ein(4)) or (ein(4) and (not ein(3))));
p5 <= p765 and (z43210 or somep5);
p125<= (p1 or p2 or p5);
p4 <= p765 and not p125;
p12345<= p125 or p3 or p4;
p6 <= ein(3) and ein(2) and ein(1) and (not p12345),
p8 <= '1' when ((ein = "00100000") or (ein = "00000001") or (ein = "00110011"))
else '0';
p7 <= z43210 and (not (p5 or p8));
p0 <= not (p12345 or p6 or p7 or p8);
nein1<= not ein(1);
nein0<= not ein(0);
m0<= p0 & p0 & p0 & p0 & p0 & p0 & p0 & p0 & p0;
m1<= p1 & p1 & p1 & p1 & p1 & p1 & p1 & p1 & p1;
m2<= p2 & p2 & p2 & p2 & p2 & p2 & p2 & p2 & p2;
m3<= p3 & p3 & p3 & p3 & p3 & p3 & p3 & p3 & p3;
m4<= p4 & p4 & p4 & p4 & p4 & p4 & p4 & p4 & p4;
m5<= p5 & p5 & p5 & p5 & p5 & p5 & p5 & p5 & p5;
m6<= p6 & p6 & p6 & p6 & p6 & p6 & p6 & p6 & p6;
m7<= p7 & p7 & p7 & p7 & p7 & p7 & p7 & p7 & p7;
m8<= p8 & p8 & p8 & p8 & p8 & p8 & p8 & p8 & p8;
    r0<=  ein(7) & ein(6) & ein(5) & ein(4) & ein(3) & ein(2) & ein(1) & ein(0) & '0';
    r1<=  '1'    & '0'    & ein(7) & ein(6) & ein(2) & ein(1) & ein(0) & '0'    & '1';
    r2<=  '0'    & '0'    & '1'    & '1'    & '0'    & ein(1) & ein(0) & '0'    & '1';
    r3<=  '0'    & '1'    & ein(7) & ein(6) & '1'    & '1'    & '0'    & '0'    & '1';
    r4<=  '0'    & '0'    & ein(4) & ein(3) & ein(2) & ein(1) & ein(0) & '0'    & '1';
    r5<=  '1'    & '1'    & '0'    & ein(4) & ein(3) & '0'    & ein(2) & '0'    & '1';
    r6<=  '0'    & '1'    & ein(7) & ein(6) & ein(5) & ein(4) & ein(0) & '0'    & '1';
    r7<=  '1'    & '1'    & '0'    & '1'    & ein(7) & ein(6) & ein(5) & '0'    & '1';
    r8<=  '1'    & '1'    & '0'    & '0'    & ein(4) & nein1  & nein0  & '0'    & '1';
eout <= (m0 and r0) or
    (m1 and r1) or
    (m2 and r2) or
    (m3 and r3) or
    (m4 and r4) or
    (m5 and r5) or
    (m6 and r6) or
    (m7 and r7) or
    (m8 and r8);
end epr89enc_arc;
```

APPENDIX B

VHDL Source Code for Decoder

```
library ieee;
use ieee.std_logic_1164.all;
entity epr89dec is port (
    din: in std_ulogic_vector (8 downto 0);
    dout: out std_ulogic_vector (7 downto 0);
    eraser: out std_ulogic);
end epr89dec;
architecture epr89dec_arc of epr89dec is
signal p0, p1, p2, p3, p4, p5, p6, p7, p8, p9, p8d5: std_ulogic;
signal d1a5, d191, tmp4, tmp5, tmp6, tmp7, tmp8, tmp9, ndin3, ndin2: std_ulogic;
signal din181: std_ulogic_vector (8 downto 0);
signal din1f3: std_ulogic_vector (8 downto 0);
signal din1fb: std_ulogic_vector (8 downto 0);
signal din19f: std_ulogic_vector (8 downto 0);
signal din1e1: std_ulogic_vector (8 downto 0);
signal din1e9: std_ulogic_vector (8 downto 0);
signal m0, m1, m2, m3, m4, m5, m6, m7, m8, m9: std_ulogic_vector (7 downto 0);
signal r0, r1, r2, r3, r4, r5, r6, r7, r8, r9: std_ulogic_vector (7 downto 0);
begin
tmp9 <= '1' when ((din = "001100110") or (din = "110011001")) else '0';
p9 <= (din(1) and din(0)) or
        (din(4) and din(3) and din(2)) or
      (din(6) and din(5) and din(4)) or
      (din(8) and din(7) and din(6)) or
      (not (din(5) or din(4) or din(3) or din(2) or din(1) or din(0))) or
      (not (din(8) or din(7) or din(6) or din(5) or din(4) or din(3) or din(2))) or
      tmp9;
din181 <= din and "110000001";
din1f3 <= din and "111110011";
din1fb <= din and "111111011";
din19f <= din and "110011111";
din1e1 <= din and "111100001";
din1e9 <= din and "111101001";
p0 <=    (not din(0));
p2 <=    '1' when (din1f3 = "001100001") else '0';
tmp4 <=  '1' when (din181 = "000000001") else '0';
p4 <=    tmp4 and (not p2);
p3 <=    '1' when (din19f = "010011001") else '0';
tmp6 <=  '1' when (din181 = '010000001") else '0';
p6 <=    tmp6 and (not p3);
p1 <=    '1' when (din181 = "100000001") else '0';
d1a5 <=  '1' when (din = "110100101") else '0';
d191 <=  '1' when (din = "110010001") else '0';
tmp7 <=  '1' when (din1e1 = "110100001") else '0';
p7 <=    tmp7 and (not d1a5) and (not d191);
tmp5 <=  '1' when (din1e9 = "110000001") else '0';
p5 <=    (tmp5 or d1a5) and (not d191);
tmp8 <=  '1' when (din1fb = "110001001") else '0';
p8 <=    tmp8 or d191;
p8d5 <=  not (din(2) xor din(3));
ndin3 <= not din(3);
ndin2 <= not din(2);
m0<= p0 & p0 & p0 & p0 & p0 & p0 & p0 & p0;
m1<= p1 & p1 & p1 & p1 & p1 & p1 & p1 & p1;
m2<= p2 & p2 & p2 & p2 & p2 & p2 & p2 & p2;
m3<= p3 & p3 & p3 & p3 & p3 & p3 & p3 & p3;
m4<= p4 & p4 & p4 & p4 & p4 & p4 & p4 & p4;
m5<= p5 & p5 & p5 & p5 & p5 & p5 & p5 & p5;
m6<= p6 & p6 & p6 & p6 & p6 & p6 & p6 & p6;
m7<= p7 & p7 & p7 & p7 & p7 & p7 & p7 & p7;
m8<= p8 & p8 & p8 & p8 & p8 & p8 & p8 & p8;
  r0<= din(8) &  din(7) &  din(6) &  din(5) &  din(4) &  din(3) &  din(2) &  din(1);
  r1<= din(6) &  din(5) &  '1'    &  '1'    &  '1'    &  din(4) &  din(3) &  din(2);
  r2<= '1'    &  '1'    &  '1'    &  '1'    &  '1'    &  '1'    &  din(3) &  din(2);
  r3<= din(6) &  din(5) &  '1'    &  '1'    &  '1'    &  '1'    &  '1'    &  '1';
  r4<= '1'    &  '1'    &  '1'    &  din(6) &  din(5) &  din(4) &  din(3) &  din(2);
  r5<= '1'    &  '1'    &  '1'    &  din(5) &  din(4) &  din(2) &  din(2) &  din(2);
  r6<= din(6) &  din(5) &  din(4) &  din(3) &  '1'    &  '1'    &  '1'    &  din(2);
  r7<= din(4) &  din(3) &  din(2) &  '0'    &  '0'    &  '0'    &  '0'    &  '0';
  r8<= '0'    &  '0'    &  p8d5   &  din(4) &  '0'    &  '0'    &  ndin3  &  ndin2;
dout <= (m0 and r0) or
        (m1 and r1) or
    (m2 and r2) or
    (m3 and r3) or
    (m4 and r4) or
    (m5 and r5) or
    (m6 and r6) or
```

APPENDIX B-continued

VHDL Source Code for Decoder

```
    (m7 and r7) or
    (m8 and r8);
eraser <= p9;
end epr89dec_arc;
```

The subject matter claimed is:

1. A method for communicating a digital signal in a manner reducing risk of corruption of said signal by noise, said method comprising steps of:

(a) encoding an 8-bit byte of digital input signal to provide a 9-bit codeword signal such that: (i) no sequence of 4 consecutive transitions occurs in said 9-bit codeword signal, (ii) said 9-bit codeword signal does not end with a sequence of 2 or more consecutive transitions, (iii) said 9-bit codeword signal does not begin with more than 2 consecutive transitions, and (iv) sequences of 3 consecutive transitions, if any, begin only on a 2nd, 4th, 6th, or 9th bit of said 9-bit codeword signal;

(b) serializing said 9-bit codeword signal to generate a serialized subsequence signal;

(c) precoding said serialized subsequence signal by subjecting it to a transfer function $1/(1 \oplus D)$ to generate a precoded serialized signal, where D represents a previous bit in a signal subjected to a transfer function;

(d) equalizing said precoded serialized signal for a transmission path subject to possible noise corruption, the precoded serialized signal being equalized to provide a coded serialized signal such that, when the coded serialized signal thereafter has been transmitted over the transmission path, the precoded serialized signal will have been subjected to an effective transfer function selected from a group consisting of: (i) an EPR4 channel transfer function of $(1-D)(1+D)^2$ and (ii) an $E^2PR4$ channel transfer function of $(1-D)(1+D)^3$;

(e) communicating said coded serialized signal over said transmission path to produce a possibly corrupted signal;

(f) providing said possibly corrupted signal received from said transmisstion path to a Viterbi detector to generated a maximum likelihood estimate signal, said Viterbi detector utilizing a transfer function inverse to the effective transfer function of the equalizing step;

(g) subjecting said maximum likelihood estimate signal to a transfer function that is the inverse of $1/(1 \oplus D)$ to generate a most probable estimate signal;

(h) deserializing said most probable estimate signal to generate a deserialized estimate signal; and (i) decoding said deserialized estimate signal inversely with respect to the encoding step such that an 8-bit byte of digital output signal is provided which is a most probable estimate of said 8-bit byte of said digital input signal.

2. The method of claim 1 wherein said encoding comprises as a further limitation that no 9-bit codeword signal can have identical 1st, 3rd, 5th, 7th, and 9th bit in non-return to zero (NRZ) notation.

3. The method of claim 1 wherein said encoding comprises as a further limitation that no coded non-return to zero inverse (NRZI) sequence can contain a substream of same even or odd numbered consecutive inputs in non-return to zero (NRZ) notation.

4. The method of claim 1 wherein said encoding comprises as a further limitation that no coded non-return to zero inverse (NRZI) sequence can begin with seven or more 0s or end with six or more 0s, in NRZI notation.

5. The method of claim 1 wherein said transmission path comprises a transmission path selected from a group consisting of: a wireless telecommunications link, a telephone telecommunications link, circuitry within a disk drive system, a magnetic domain of a disk drive recording medium coupled to a disk drive read head element coupled to an output port of said disk drive, and a magnetic domain of a disk drive recording medium coupled to a disk drive write head element coupled to an input port of said disk drive.

6. An encoder for generating a 9-bit codeword representative of an 8-bit byte of information, comprising:

(a) an input which receives an 8-bit byte of a digital input signal; and (b) selective codeword means, operatively coupled to the input, for generating selected codewords of $2^9$ (512) possible 9-bit codeword signals that can be 1:1 mapped to $2^8$ (256) possible 8-bit bytes of the digital input signal, the selected codewords not including any of the possible 9-bit codewords having any undesirable characteristics, these undesirable include having: (i) any sequence of 4 consecutive transitions occurs therein, (ii) an ending sequence of 2 or more consecutive transitions, (iii) a beginning sequence of more than 2 consecutive transitions, and (iv) a sequence of 3 consecutive transitions begins on a 1st, 3rd, 5th, 7th, or 8th bit of the codeword signal.

7. An encoder according to claim 6, wherein said encoder is a semiconductor array of gates.

8. An encoder according to claim 6, further comprising means for eliminating any possible 9-bit codeword having identical 1st, 3rd, 5th, 7th, and 9th bit in non-return to zero (NRZ) notation.

9. An encoder according to claim 6, further comprising means for imposing a limitation that no coded non-return to zero inverse (NRZI) sequence can contain a substream of same even or odd numbered consecutive inputs in non-return to zero (NRZ) notation.

10. An encoder according to claim 6, further comprising means for imposing a limitation that no coded non-return to zero inverse (NRZI) sequence can begin with seven or more 0s or end with six or more 0s, in NRZI notation.

11. An apparatus for encoding a digital signal and preparing said signal for transmission, in a manner which reduces risk of corruption of said signal by noise which includes the encoder of claim 6, said apparatus comprising:

(a) a serializer, operatively coupled to an output of said encoder, which serializes a stream of output selected 9-bit codewords of said encoder which are mapped from 8-bit bytes of said digital input signal to generate a serialized subsequence signal;

(b) a precoder, operatively coupled to an output of said serializer, which generates a precoded serialized signal from said serialized subsequence signal based on a transfer function $1/(1 \oplus D)$, where D represents a previous bit in a signal subjected to a transfer function;

(c) an equalizer, operatively coupled to an output of said precoder, which equalizes said precoded serialized signal for transmission over a transmission path subject to possible noise corruption, the equalizer comprising means for equalizing said precoded serialized signal to provide a coded serialized signal such that, when the coded serialized signal thereafter has been transmitted over the transmission path, the precoded serialized signal will have been subjected to an effective transfer function selected from a group consisting of: (i) an EPR4 channel transfer function of $(1-D)(1+D)^2$ and (ii) an $E^2PR4$ channel transfer function of $(1-D)(1+D)^3$; and (d) a communication port, operatively coupled to an output of said equalizer, which provides said coded serialized signal to said transmission path.

12. The apparatus of claim 11 wherein said transmission path comprises a transmission path selected from a group consisting of: a wireless telecommunications link, a telephone telecommunications link, circuitry within a disk drive system, a magnetic domain of a disk drive recording medium coupled to a disk drive read head element coupled to an output port of said disk drive, and a magnetic domain of a disk drive recording medium coupled to a disk drive write head element coupled to an input port of said disk drive.

13. A decoder for generating an estimated 8-bit byte of information representative of a 9-bit codeword, comprising:

(a) an input which receives an 9-bit codeword signal; and (b) decoder means, operatively coupled to the input, for estimating 8-bit bytes from the 9-bit codeword signal based on selected codewords of $2^9$ (512) possible 9-bit codeword signals that can be 1:1 mapped from $2^8$ (256) possible 8-bit information signals, the selected codewords being constrained to not included any of the possible 9-bit codewords having any undesirable characteristics, these undesirable include having: (i) any sequence of 4 consecutive transitions occurs therein, (ii) an ending sequence of 2 or more consecutive transitions, (iii) a beginning sequence of more than 2 consecutive transitions, and (iv) a sequence of 3 consecutive transitions begins on a 1st, 3rd, 5th, 7th, or 8th bit of the codeword signal.

14. A decoder according to claim 13, wherein said decoder is a semiconductor array of gates.

15. A decoder according to claim 13, further comprising means for eliminating any possible 9-bit codeword having identical 1st, 3rd, 5th, 7th, and 9th bit in non-return to zero NRZ) notation.

16. A decoder according to claim 13, further comprising means for imposing a limitation that no coded non-return to zero inverse (NRZI) sequence can contain a substream of same even or odd numbered consecutive inputs in non-return to zero (NRZ) notation.

17. A decoder according to claim 13, further comprising means for imposing a limitation that no coded non-return to zero inverse (NRZI) sequence can begin with seven or more 0s or end with six or more 0s, in NRZI notation.

18. An apparatus for detecting estimated 8-bit bytes from an input signal, wherein the input signal has been communicated over over a transmisstion path having possibly been corrupted by noise and wherein the input signal has been equalized prior to communication over said communication path such that said input signal has been subjected to an effective transfer function selected from a group consisting of: (i) an EPR4 channel transfer function of $(1-D)(1+D)^2$ and (ii) an $E^2PR4$ channel transfer function of $(1-D)(1+D)^3$, where D represents a previous bit in a signal subjected to a transfer function, the apparatus including the the decoder of claim 13 and further comprising:

(a) Viterbi detector means for processing said input signal through a maximum likelihood sequence estimation algorithm having a trellis structure selected from a group consisting of: (i) an EPR4 trellis code structure and (ii) an $E^2PR4$ trellis code structure to generate a 9-bit serialized maximum likelihood estimate signal;

(b) an inverse precoder, operatively coupled to an output of said Viterbi detector means, which subjects said 9-bit serialized maximum likelihood estimate signal to a transfer function that is inverse to $1/(1 \oplus D)$ to generate a 9-bit serialized inverted estimate signal;

(c) a deserializer, operatively coupled to an output of said inverse precoder and to said decoder, which deserializes said precoded 9-bit serialized inverted estimate signal to generate a deserialized 9-bit codeword of estimate signal which is provided to said decoder as said 9-bit codeword signal.

19. The apparatus of claim 18 wherein said transmission path comprises a transmission path selected from a group consisting of: a wireless telecommunications link, a telephone telecommunications link, circuitry within a disk drive system, a magnetic domain of a disk drive recording medium coupled to a disk drive read head element coupled to an output port of said disk drive, and a magnetic domain of a disk drive recording medium coupled to a disk drive write head element coupled to an input port of said disk drive.

20. A method of encoding a digital data signal in computer-readable form which has been embodied in a tangible medium of information storage, in accordance with the following steps:

(a) encoding an 8-bit type of digital input signal to provide a 9-bit codeword signal such that: (i) no sequence of 4 consecutive transitions occurs in said 9-bit codeword signal, (ii) said 9-bit codeword signal does not end with a sequence of 2 or more consecutive transitions, (iii) said 9-bit codeword signal does not begin with more than 2 consecutive transitions, and (iv) sequences of 3 consecutive transitions, if any, begin only on a 2nd, 4th, 6th, or 9th-bit codeword signal;

(b) serializing said 9-bit codeword, whereby a serialized subsequence signal is provided;

(c) precoding said serialized subsequence signal by subjecting it to a transfer function $1/(1 \oplus D)$, whereby a precoded serialized signal is provided; and (d) equalizing said precoded serialized signal thereafter has been transmitted to the receiving signal such that, when the coded serialized signal thereafter has been transmitted to the receiving location form the point of transmission, the precoded serialized signal will have been subjected to an effective transfer function of $(1-D)(1+D)^2$ for EPR4 or to an effective transfer function of $(1-D)(1+D)^3$ for $E^2PR4$.

21. A method of transmitting intelligible information to a receiving location distanced from a point of transmission, said method comprising transmitting from the point of transmission to the receiving location electromagnetic radiation carrying information encoded onto the electromagnetic radiation in accordance with the following coding steps:

(a) encoding an 8-bit byte of digital input signal to provide a 9-bit codeword signal such that: (i) no sequence of 4 consecutive transitions occurs in said 9-bit codeword signal, (ii) said 9-bit codeword signal does not end with a sequence of 2 or more consecutive transitions, (iii) said 9-bit codeword signal does not begin with more than 2 consecutive transitions, and (iv) sequences of 3 consecutive transitions, if any, begin only on a 2nd, 4th, 6th, or 9th bit of said 9-bit codeword signal;

(b) serializing said 9-bit codeword signal, whereby a serialized subsequence signal is provided;

(c) precoding said serialized subsequence signal by subjecting it to a transfer function $1/(1 \oplus D)$, whereby a precoded serialized signal is provided; and (d) equalizing said precoded serialized signal to provide a coded serialized signal such that, when the coded serialized signal thereafter has been transmitted to the receiving location from the point of transmission, the precoded serialized signal will have been subjected to an effective transfer function of $(1-D)(1+D)^2$ for EPR4 or to an effective transfer function of $(1-D)(1+D)^3$ for $E^2PR4$.

* * * * *